United States Patent [19]

Hartig

[11] 4,088,874
[45] May 9, 1978

[54] PULSE SEQUENCE GENERATOR

[76] Inventor: Gunter Fritz Hartig, Hansastrasse 29, Karlsruhe 21, Germany, D-7500

[21] Appl. No.: 699,600

[22] Filed: Jun. 24, 1976

[30] Foreign Application Priority Data

Jul. 2, 1975 Switzerland ..................... 8605/75
Jul. 18, 1975 Germany ........................ 2532267

[51] Int. Cl.² .......................................... H03K 21/36
[52] U.S. Cl. ..................... 235/92 DE; 235/92 CV; 235/92 TF; 235/92 R; 331/65
[58] Field of Search ........ 235/92 TF, 92 CY, 92 DE; 340/347; 331/65, 46

[56] References Cited

U.S. PATENT DOCUMENTS

| 3,419,880 | 12/1968 | Takano et al. ............... 235/92 TF |
| 3,421,106 | 1/1969 | Garber et al. ............... 331/65 |
| 3,790,910 | 2/1974 | McCormack ................. 235/92 CY |
| 3,851,242 | 11/1974 | Ellis .......................... 331/65 |
| 3,886,473 | 5/1975 | Heyck ........................ 331/65 |
| 3,891,918 | 6/1975 | Ellis .......................... 331/65 |

Primary Examiner—Joseph M. Thesz
Attorney, Agent, or Firm—Toren, McGeady and Stanger

[57] ABSTRACT

A pulse sequence generator for the production of pulse sequences whose pulse count depends on a geometrical value, such as a distance or an angle, comprises a first pulse generator which generates a sequence of pulses the freqency of which depends on the geometrical value and a time signal generator which controls the duration of the sequence of pulses. The time signal generator comprises a second pulse generator of the same design as the first pulse generator and a counter which switches on the first pulse generator for the duration of a predetermined number of pulses from the second pulse generator. The frequency ratio of the two pulse generators is variable by the geometrical value.

23 Claims, 6 Drawing Figures

PULSE SEQUENCE GENERATOR

BACKGROUND OF THE INVENTION

1. Field of the Invention

The invention relates to a pulse sequence generator for the production of pulse sequences of which the pulse count depends on a geometrical value in particular a distance or angle value, having a first pulse generator for the production of pulse sequences, in which the time interval between the pulses depends on the geometrical value, in particular the distance or angle value, and having a time signal transmitter which controls the duration of the pulse sequence given off in each case by the first pulse generator.

2. Description of the Prior Art

Various pulse sequence generators are already known in which the number of pulses of a pulse sequence obtained at the output depends on a geometrical value. For example it is a known practice for this purpose to use a frequency generator in the frequency determining circuit of which there is a coil whose inductivity is varied as a function of the mechanical value, in which for example a core is displaced in the coil as a function of the mechanical value. After this frequency generator there is arranged a gate which is open for a predetermined constant period of time so that at the output of this gate there appears a pulse sequence of which the pulse count depends in each case on the frequency of the frequency generator and thus on the mechanical value.

In addition, pulse sequence generators are known in which the basic switching arrangement is in theory designed exactly like the above mentioned known switching arrangement but in which the frequency of the frequency generator is maintained constant and the period of time for which the gate is opened at the output of which the desired pulse sequence is obtained, is varied as a function of the mechanical value.

Both pulse sequence generators mentioned have the disadvantage that they are very sensitive to unavoidable but undesirable variations in operating conditions such as influences due to temperature, ageing and operating voltage, as different component groups are used for the production of the frequency of the frequency generator and the time value with which the opening of the gate is controlled.

SUMMARY OF THE INVENTION

The object of the invention is to provide a pulse sequence generator for the production of digital pulse sequences of the above mentioned type, which avoids the above disadvantages and thus in particular is substantially insensitive to undesirable parameters and influences, for example temperature variations, variations of operating voltage, ageing phenomena etc., so that therefore the number of pulses of a pulse sequence obtained for predetermined geometrical values at the output of the pulse sequence generator is in practice not altered by undesirable parameters or influences.

This is achieved according to the invention in the pulse sequence generator described above by the time signal transmitter being provided with a second pulse generator which is of the same design as the first pulse generator and in particular is constructed in an identical manner to the first pulse generator; and is also provided with a counter which switches on the first pulse generator during the occurrence of a predetermined number of pulses of the second pulse generator, and the frequency ratio of the two pulse generators can be varied by the geometrical value. In this way, in particular when the frequency determining switching elements are provided on a common support body, the result is achieved that when the number of pulses delivered by the first pulse generator per unit time varies because of undesirable parameters of influences, for example because of temperature variations, operating voltage variations, ageing phenomena etc., the number of pulses produced in the second pulse generator per unit time also undergoes a change in the same direction, so that the time interval $t$, during which the desired pulse sequence is taken from the first pulse generator is varied in the inverse direction.

If therefore, for example, the frequency of the first pulse generator is increased by temperature effects, then the frequency of the second pulse generator undergoes a corresponding increase. Since then the time during which the desired pulse sequence is taken from the first pulse generator is determined by the occurrence of a predetermined pulse number in the second pulse generator and is thus inversely proportional to the pulse frequency of the second pulse generator in this case pulses are taken from the first pulse generator for a shorter time, and thus the frequency increase due to undesirable influences is automatically compensated by a reduction of the time during which the pulses are taken from the desired pulse sequence. Accordingly, a reduction of the pulse sequence frequency because of undesirable influences is automatically compensated by the arrangement according to the invention by an increase of the time period during which the pulses are taken from the desired pulse sequence.

It should be indicated at this point that the term "switching on" of the first pulse generator should generally be understood to mean the time during which in each case pulses can be taken from the first pulse generator. In the case of direct coupling of the output for the desired pulse sequences to the first pulse generator the "switching on" can therefore be understood to mean the starting of this pulse generator. If however the output of the first pulse generator is guided via a gate, at the output of which the desired pulse sequences are taken, the first pulse generator can be operated without interruption, so that by the "switching on" of this pulse generator one should understand the time in which the gate is opened for the passage of pulses.

In a preferred embodiment of the invention, the number of pulses of the second pulse generator, during the occurrence of which the first pulse generator is switched on, can be controlled externally. In this way pulse sequences of differing pulse count can be associated with a predetermined amount of a geometrical value with an otherwise identical setting, so that to a certain extent by the control system mentioned the "scale" of the geometrical value expressed in pulse counts can be varied.

A particularly advantageous embodiment of the pulse sequence generator according to the invention is obtained if the frequency of each of the two impulse generators is variable by at least one switching element in each case, both switching elements having an actuation element rotatable or movable as a function of the geometrical value and varying the frequency determining value of the switching elements, in such a way that by the rotation or displacement of the actuation element the ratio of the frequency of the first pulse generator to the frequency of the second pulse generator is varied. In particular, the switching element by which the frequency of the pulse generator can be varied, can be at least one coil in each pulse generator, one or both coils having as the actuation element a core varying their inductivity, which can be rotated or displaced as a function of the geometrical value, so that the inductivity of the coil is varied as a function of the geometrical value. In this arrangement both coils can be a common core, which is arranged so that on its displacement, at least in a specific rotation or displacement range, the variation of the inductivity of the coils takes place in opposing directions, so that the inductivity of one coil is increased and at the same time the inductivity of the other coil is reduced.

By means of the above embodiment of the pulse sequence generator according to the invention it is possible to substantially increase the sensitivity thereof in relation to the geometrical value, since in the event of a variation of the geometrical value the frequency of the first generator can be simultaneously varied in the opposite direction to the frequency of the second generator. If therefore for example the frequency of the first generator is increased, then a reduction of the frequency of the second generator takes place, as a result of which the time $t$ during which the pulses appear at the output of the first generator is increased, so that therefore per unit value of the variation of the geometrical value a substantially greater variation of the pulse count of the particular pulse sequence can be achieved than if only the frequency of the first pulse generator were increased and the frequency of the second pulse generator maintained constant.

Furthermore it is possible for one of the two coils or both coils to have a winding density which varies over their length; the core also may have a permeability varying over its length. This permits the achievement of any desired curve of the pulse count N per pulse sequence as a function of the geometrical value, for example a displacement or rotation.

In detail the design can be such that the core consists at least partially of field-repelling material, for example aluminium and/or at least partially of ferritic material. In the case of a linear arrangement, the bobbins can be arranged coaxially next to one another and have a common core consisting substantially of field-repelling material; or alternatively the core can have two ferritic parts one of which being associated with each of the two coils and having a screen between them to separate the two coils.

In the case of a circular arrangement in which the coils are arranged next to one another on a circle the coil of each pulse generator can consist of at least two part coils, which are connected in series and wound to the same size but in opposite directions to one another and which are arranged radially opposite one another, the coil axes extending perpendicular to the plane of the circle and a core of field-repelling and/or ferritic material being rotatable perpendicular to the coil axes through or over the coils. In particular in this arrangement the coils can be wound on first sectors of a ferrite shell-type core extending perpendicularly to the plane of the circle, above which second sectors are rotatably arranged extending in the same way but being only half as many and being arranged diametrically on a parallel circle of the same size, one group of sectors being connected to one another on their side opposite the other sectors by a ferrite disc and in the centres of the ferrite discs a core being provided extending perpendicular to the plane of the circles.

It should be mentioned that in the case of the pulse sequence generator according to the invention the counter or the decoding system thereof can be controllable from outside so that the two pulse generators can be switched on for varying periods of time.

BRIEF DESCRIPTION OF THE DRAWINGS

The invention is illustrated further below with reference to preferred embodiments shown in the accompanying drawing, in which.

DESCRIPTION OF THE PREFERRED EMBODIMENTS

Figure 1:
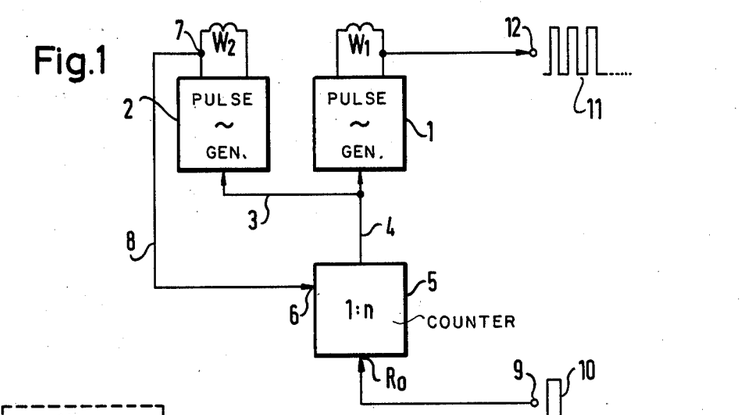
FIG. 1 shows a block circuit diagram of a pulse sequence generator according to the invention.

The pulse sequence generator shown in FIG. 1 comprises a first pulse generator 1, which when switched on produces pulses continuously, the time interval between the pulses or the pulse frequency being dependent upon a geometrical value, for example the value of a distance or angle. The variation of the frequency of the first pulse generator 1 is effected by the inductivity of a coil W1, which is a frequency determining element of this pulse generator, being varied as a function of the geometrical value.

In addition, a second pulse generator 2 is provided which in its construction and design is identical to the first pulse generator 1. The pulse generator 2 has a coil W2 whose inductivity which is a frequency determining element of this pulse generator can be varied as a function of the same geometrical value as the inductivity of the coil W1.

The alteration of the inductivities of the coils W1 and W2 is effected in such a way that the ratio of the frequency f1 of the pulse generator 1 to the frequency f2 of the pulse generator 2 is varied by the geometrical value. The pulse generators 1 and 2 are connected to a counter 5 via connections 3, 4 in such a way that the counter 5 on command switches on the two pulse generators 1, 2 and switches them off on reaching a specified count position. The counter 5 can for example be a reduction circuit with a reduction ratio of 1 to $n$ so that after counting in each case $n$ pulses via the connections 3, 4 it gives the switching off command to the two pulse generators 1, 2. The count input 6 of the counter 5 is connected to the pulse delivering output 7 of the pulse generator 2 via the connection 8. Pulses 10 can be introduced via the control input 9 of the counter by which the switching on command is tripped for the pulse generators 1, 2.

The desired sequence 11 is produced at the pulse delivering output 12 of the pulse generator 1.

The method of working of the switching arrangement according to FIG. 1 is as follows.

First let the two pulse generators 1 and 2 be disconnected and the counter 5 be at the counting position "O". If a control pulse 10 is then introduced via the control input 9 into the counter 5, this control pulse 10 trips a switching on command for the two pulse generators 1, 2 in the counter 5, which is supplied to the pulse generators via the connections 3, 4. Then both pulse generators begin to produce pulses. While the pulses 11 of the pulse generator 1 are collected at its output 12 the pulses produced at the output 7 of the pulse generator 2 are supplied via the connection 8 to the counting input 6 of the counter 5. When the counter 5 has reached a predetermined counting position, a switching off signal is tripped in this counter. The off signal is supplied to the pulse generators 1, 2 via the connections 3, 4 and switches them off. Thus no further pulses 11 appear at the output 12 so that the desired pulse sequence appears at the output 12 in the time which elapses between the switching on and switching off command for the pulse generator 1.

The pulse generator 1 can also be termed an output pulse generator because it delivers the desired output pulses 11, while the pulse generator 2 can also be termed a timing pulse generator because it determines the time for which the pulse generator 1 is operated, in conjunction with the counter 5.

To obtain pulse frequencies continuously, pulses 10 can be fed continuously to the counter 5 at the input 9 and this can be done at a predetermined time interval which of course is greater than the duration of the particular operating time of the pulse generators 1 and 2.

Figure 2:
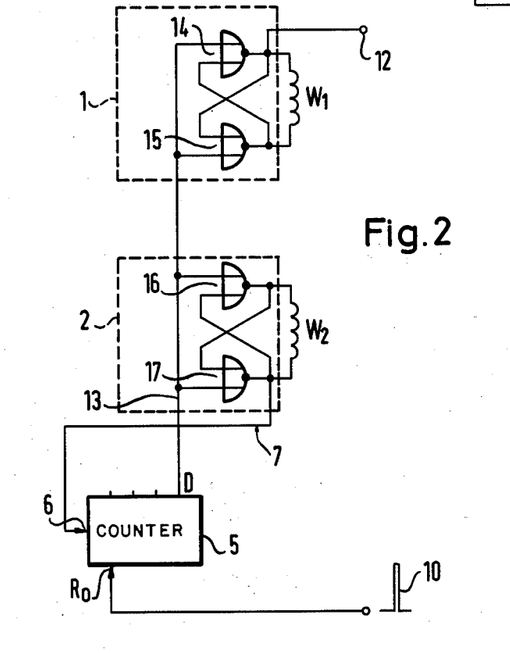
FIG. 2 shows an embodiment in detail of a circuit with which the block circuit diagram of FIG. 1 can be realised.

The skilled man will recognise that the two generators 1 and 2 can also be switched on for different, overlapping time intervals. For example the output pulse generator 1 can be switched on for only a shorter time than the timing pulse generator 2, e.g. in the time interval between the counter positions 2 and 6 of the counter 5, a process which can be effected by a corresponding decoding of the counter 5 which can be carried out in known manner. It is also possible to modify the decoding of the counter 5 or to modify the counter 5 itself from outside via a corresponding known control system. A possible detailed embodiment of the circuit according to FIG. 1 is shown in FIG. 2. This circuit comprises two integrated circuits, one of which forms each of the two pulse generators 1 and 2 in connection with the coils W1 and W2 and the blocking circuit 13 which corresponds to the connections 3, 4 in FIG. 1. This IC can for example be a component of the type SN 7402 (Quad-2 input NOR). This IC consists of four NOR gates 14 to 17 each having two inputs, one input of each gate being connected to the common blocking circuit 13. Individually the two generators 1, 2 are each formed by two cross-coupled gates 14, 15 or 16, 17 whose outputs are connected to the relevant inductivity W1 or W2. At the position "0" on the blocking circuit 13 the pulse generators 1 and 2 are switched on. The pulse generator 1 during its working duration delivers the outut pulse sequence 11 at the output 12; the pulse generator 2 during the same working duration delivers beat pulses at its output 7, which is connected to the counting input 6 of the counter 5. The counter 5 can for example be an IC of the type SN 7493.

In the present circuit, the blocking circuit 13 is located at the output of the fourth binary stage which after eight timing pulses arriving at the counter input 6 produces at its output D the position "1", as a result of which the pulse generators 1, 2 are blocked. The switching on duration $t$ of the pulse generators is in this example:

$$t = 1/f_2 \cdot n$$

in which $f_2$ represents the frequency of the generator 2, while $n$ represents the number of timing pulses required at the output 6 before the pulse generators are switched off.

The circuit is made to deliver a renewed output pulse sequence 11 by a positive reset pulse 10 to the reset input Ro of the counter 5, since with the reset pulse 10, the blocking circuit 13 for the pulse generators 1, 2 is brought into the position 0 as a result of which the pulse generators begin to work again.

Figure 3:
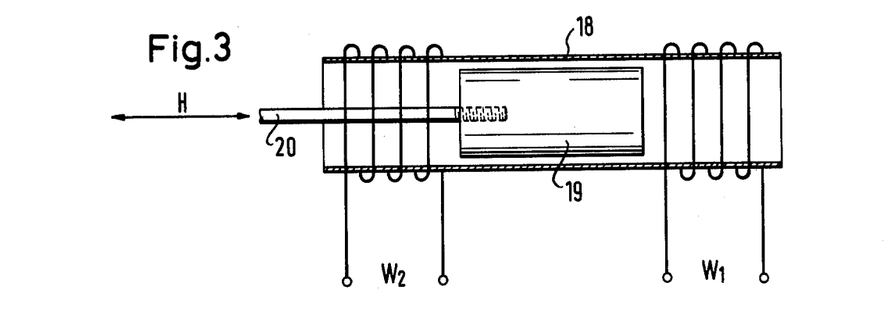
FIG. 3 shows a linear arrangement of the coils of the two frequency generators according to FIGS. 1 and 2, whose frequency can be varied by the displacement of a core associated in common with the coils.
Figure 5:
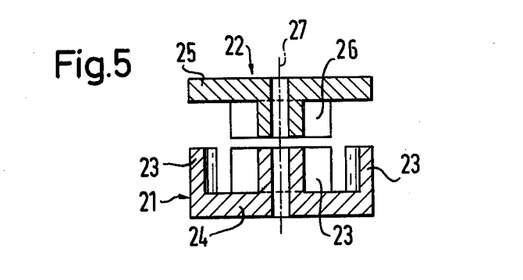
FIG. 5 shows a longitudinal section through the core arrangement of FIG. 4 in the assembled state.

Embodiments of the coils W1 and W2 in conjunction with a common core which is displaceable and rotatable as a function of the geometrical value are shown in FIGS. 3 and 5.

FIG. 3 shows a linear coil arrangement in which the coils W1 and W2 are wound coaxially at a distance from one another on a common hollow cylindrical coil carrier 18. A core 19 and with it the coils W1 and W2 can be moved into the coil carrier 18 in the axial direction of the coil carrier, the core dimensions being selected in relation to the coils in such a way that when the core 19 is moved, the ratio of the frequency $f1$ of the pulse generator 1 to the frequency $f2$ of the pulse generator 2 is varied. In particular the length of the core 19 is such that simultaneously with a noticeable reduction of the inductivity of the coil W1, a noticeable increase of the inductivity of the coil W2 takes place and vice versa.

The core 19 is mounted on a rod 20 which for example can be displaced as a function of the distance value $f$ within the stroke H, which is indicated by the double arrow. This distance value $s$ can for example be the particular adjustment of the accelerator pedal of a motor vehicle for which purpose the rod 20 is connected to the linkage of the accelerator pedal. In this case therefore, at the output 12 of a pulse sequence generator provided with the coil arrangement according to FIG. 3, pulse sequences are obtained having a pulse count which in each case depends on the position of the accelerator pedal. The core 19 in the embodiment of FIG. 3 consists of field repelling material, for example aluminium, but can be of ferritic material. In the latter case, however, in order to separate the coils W1 and W2 a screen must be provided in the longitudinal centre of the core so that to a certain extent it consists of two ferritic parts of which one works with the coil W1 and the other with the coil W2 and between which a screen is located.

Figure 4:
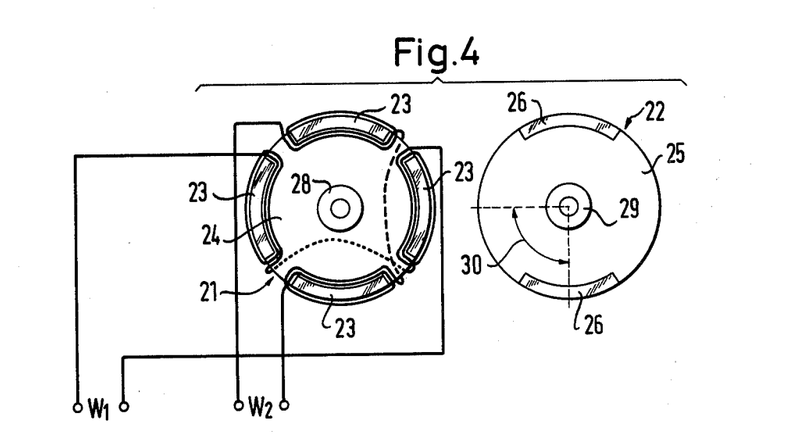
FIG. 4 shows a circular arrangement of the coils of the two pulse generators of FIGS. 1 and 2 in plan view, each of the two coils consisting of two part coils a plan view of the common core being shown in the right-hand part.

A coil arrangement of the coils W1 and W2 with which the frequency ratio $f1/f2$ can be varied as a function of the angle $\alpha$ is shown in FIGS. 4 and 5. Here the core consists of two parts, namely a ferrite shell core 21 and a core 22 which can be rotated over this, both parts being shown in longitudinal section as assembled in FIG. 5, while FIG. 4 shows plan views of both parts in a dismantled state, and the sides of the parts 21, 22 facing one another, in the assembled state can be seen. The core 21 comprises four cylinder sectors 23, consisting of ferritic material and extending upwards from a circular ferrite base plate 24. The coils W1 and W2 each consist of two part coils, which are wound on the cylinder sectors 23, so that the coil axes in FIG. 4 are perpendicular to the base plate 24. The part coils from which the coil W1 is formed, are arranged diametrically opposite, connected in series and of equal size, but in each case wound in the opposite direction to one another; the same applies to the part coils which form the coil W2.

The core 22 also has a circular base plate 25, which has the same diameter as the base plate 24, and in addition it also has two cylinder sectors 26, which for example can have the same dimensions as the cylinder sectors 23. However, only two cylinder sectors 26 arranged diametrically opposite at the circumference of the base plate 25 are provided, which in the assembled state can be rotated with the core 21 over the cylindrical sectors 23 as a function of the angle value $\alpha$, so that the frequency ratio $f_1/f_2$ can be varied by rotating the core 22 relative to the core 21 about the axis 27 (see FIG. 5).

To close the field configuration, a pin or hollow cylinder 28 or 29 is provided in the centre of the base plate 24 and 25 in each case. All the core parts 21 and 22 consist preferably of ferritic material. The angle within which a clear association of the number of pulses 11 of a pulse sequence to the angle $\alpha$ with the coil arrangement according to FIGS. 4 and 5 is given is 90° and is indicated by the double arrow 30 in FIG. 4.

It should be indicated that more than four cylinder sectors 23 may be present, the cylinder sectors being distributed symmetrically around the circumference of the circular plate 24 in such a way that pairs of cylinder sectors are produced opposite one another which are each wound with part coils, the interconnection of the part coils taking place according to the principles given in the explanation of FIGS. 4 and 5. The circular base plate 25 in this case has half as many cylinder sectors 26 which are also symmetrically distributed over the circumference of the circular plate 25.

Figure 6:
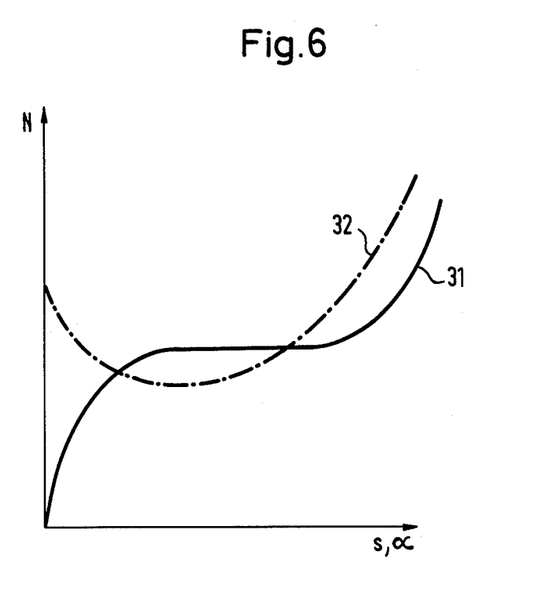
FIG. 6 shows a graph of possible characteristic curves of the pulse sequence generator.

FIG. 6 shows a graph in which on the ordinate the number N of pulses of a pulse sequence appearing at the output 12 is plotted, while the abscissa plots the geometrical value for example the distance $s$ or the angle $\alpha$. From the multitude of possible curves, by way of example, two curves 31 or 32 are shown. The trace of these curves can be achieved by the winding density of the coil W1 and/or of the coils W2 varying over the coil length or by a permeability varying over the length of the core or by both measures. The variation of the permeability of the core over its length can be achieved by the core being non-homogeneous in its material and/or in its form. For example the core 19 can run to a point in the direction of the axis of the coils W1 and W2, for example be cut obliquely. Also the sectors 26 can have an increasing height in the circumferential direction of the circular disc 25, and thus also run in a wedge shape in this circumferential direction. An example of the variation of the winding density of the coils in the axial direction of these coils can have an appearance such that the winding density of the coil W2 in FIG. 3 decreases from right to left, while the winding density of the coil W1 in this Figure increases from right to left. With a homogeneous core 19 as a result of this arrangement in the central region of the stroke H an appreciable variation of the pulse count N per unit of length of the movement of the core 19 in the axial direction would result, while in the end regions of the stroke H, this variation would become substantially flatter.

To achieve a decrease of the pulse count N at the beginning of the stroke, as represented by the curve 32 in FIG. 6, the core 19 can be provided at the rear face (on the left in FIG. 3) with a ferrite disc, whereas the rest of it consists of field-repelling material.

To achieve a plateau in the middle region, as indicated by the curve 31 in FIG. 6, a groove can be turned in the core 19.

The same applies for the arrangement according to FIGS. 4 and 5, so that with this arrangement greatly varying curve traces of the pulse count N as a function of the distance value $s$ or of the angle value $\alpha$ can be achieved.

The pulse sequence generator can be designed in such a way that the core 19 or 26 is connected to a pressure or under-pressure sensor, in particular a siphon diaphragm, so that it is displaced or rotated as a function of the pressure or under-pressure which is ascertained by the pressure or under-pressure sensor (which therefore is a pressure measurement device or a pressure recording device).

The core 19 or 26 can for example be connected via a linkage to the membrane of a siphon diaphragm which determines the under-pressure in the throttle valve duct of a motor vehicle.

Instead of connecting the core 19 or 26 to a pressure or under-pressure sensor, it is also possible for the core 19 or 26 to be in the form of the piston of a pressure or under-pressure sensor, so that it is displaced or rotated as a function of the pressure or under-pressure which is ascertained by the pressure or under-pressure sensor, the core preferably being spring loaded.

The two above mentioned embodiments, in particular the last mentioned embodiment, are particularly suitable for a linear core as shown in FIG. 3 at 19.

As already mentioned the core can be spring loaded so that it is held in a rest position by spring force when there is an over-pressure or under-pressure in relation to the ambient pressure.

I claim:

1. A pulse sequence generator for the production of pulse sequences whose pulse count depends on a geometric value, said pulse sequence generator comprising: a first pulse generator having an output and an enabling input, a second pulse generator having an output and an enabling input, and a counter having a counting output and a counting input and connected with said first and second pulse generators, said first and second pulse generators being generators providing a first pulse frequency $f_1$ and a second pulse frequency $f_2$ at the respective outputs thereof the output of said first pulse generator exhibiting the first pulse frequency $f_1$ forming the output of said pulse sequence generator, and the output of said second pulse generator exhibiting the second pulse frequency $f_2$ being directly coupled to the counting input of said counter, the counting output of said counter being connected with the enabling inputs of said first and second pulse generators so that the time of operation of said pulse generators is controlled by said counter, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each said switching element including at least one coil, and each said actuation element comprises a core which can be rotated or displaced as a function of said geometric value, whereby the inductivity of the coils is varied as a function of said geometric value said coils having a common core which is arranged so that upon its rotation or displacement in a predetermined range, the variation of the inductivities of the coils takes place in opposite directions, the inductivity of one coil is increased and simultaneously the inductivity of the other coil is reduced.

2. A pulse sequence generator for the production of pulse sequences whose pulse count depends on a geometric value, said pulse sequence generator comprising: a first pulse generator having an output and an enabling input, a second pulse generator having an output and an enabling input, and a counter having a counting output and a counting input and connected with said first and second pulse generators, said first and second pulse generators being generators providing a first pulse frequency $f_1$ and a second pulse frequency $f_2$ at the respective outputs thereof the output of said first pulse generator exhibiting the first pulse frequency $f_1$ forming the output of said pulse sequence generator, and the output of said second pulse generator exhibiting the second pulse frequency $f_2$ being directly coupled to the counting input of said counter, the counting output of said counter being connected with the enabling inputs of said first and second pulse generators so that the time of operation of said pulse generators is controlled by said counter, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each said switching element including at least one coil, and each said actuation element comprises a core which can be rotated or displaced as a function of said geometric value, whereby the inductivity of the coils is varied as a function of said geometric value, said coils being arranged coaxially next to one another and are provided with a common core consisting substantially of field-repelling material.

3. A pulse sequence generator for the production of pulse sequences whose pulse count depends on a geometric value, said pulse sequence generator comprising: a first pulse generator having an output and an enabling input, a second pulse generator having an output and an enabling input, and a counter having a counting output and a counting input and connected with said first and second pulse generators, said first and second pulse generators being generators providing a first pulse frequency $f_1$ and a second pulse frequency $f_2$ at the respective outputs thereof the output of said first pulse generator exhibiting the first pulse frequency $f_1$ forming the output of said pulse sequence generator, and the output of said second pulse generator exhibiting the second pulse frequency $f_2$ being directly coupled to the counting input of said counter, the counting output of said counter being connected with the enabling inputs of said first and second pulse generators so that the time of operation of said pulse generators is controlled by said counter, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied each said switching element including at least one coil, and each said actuation element comprises a core which can be rotated or displaced as a function of said geometric value, whereby the inductivity of the coils is varied as a function of said geometric value said coils being arranged coaxially next to one another and are provided with a common core which has two ferritic parts, which are each associated with one of said coils and have a screen between them to separate said coils.

4. A pulse sequence generator for the production of pulse sequences whose pulse count depends on a geometric value, said pulse sequence generator comprising: a first pulse generator having an output and an enabling input, a second pulse generator having an output and an enabling input, and a counter having a counting output and a counting input and connected with said first and second pulse generators said first and second pulse generators being generators providing a first pulse frequency $f_1$ and a second pulse frequency $f_2$ at the respective outputs thereof the output of said first pulse generator exhibiting the first pulse frequency $f_1$ forming the output of said pulse sequence generator, and the output of said second pulse generator exhibiting the second pulse frequency $f_2$ being directly coupled to the counting input of said counter, the counting output of said counter being connected with the enabling inputs of said first and second pulse generators so that the time of operation of said pulse generators is controlled by said counter, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each of said switching elements including at least one coil, and each said actuation element comprises a core which can be rotated or displaced as a function of said geometric value, whereby the indictivity of the coils is varied as a function of said geometric value, said coils being arranged next to one another on a circle, the coil of each said pulse generator including a plurality of part coils which are connected in series and of equal size but are wound in opposite direction to one another and are arranged radially opposite one another, the coil axes being perpendicular to the plane of the circle, a core being rotatable perpendicular to the bobbin axes through or over the coils.

5. A pulse sequence generator according to claim 4, wherein said coils are wound on first cylinder sectors of a ferrite shell core over which half as many second cylinder sectors diametrically arranged on a parallel circle of equal size are arranged rotatably, one group of sectors being connected to one another in each case by a ferrite disc on their side opposite the other sectors and in the centres of the ferrite discs a core extending perpendicular to the plane of the circles being provided.

6. A pulse sequence generator for the production of pulse sequences whose pulse count depends on a geometric value, said pulse sequence generator comprising: a first pulse generator having an output and an enabling input, a second pulse generator having an output and an enabling input, and a counter having a counting output and a counting input and connected with said first and second pulse generators, said first and second pulse generators being generators providing a first pulse frequency $f_1$ and a second pulse frequency $f_2$ at the respective outputs thereof the output of said first pulse generator exhibiting the first pulse frequency $f_1$ forming the output of said pulse sequence generator, and the output of said second pulse generator exhibiting the second pulse frequency $f_2$ being directly coupled to the counting input of said counter, the counting output of said counter being connected with the enabling inputs of said first and second pulse generators so that the time of operation of said pulse generators is controlled by said counter, and input means coupled to both of the pulse generators for varying the frequencies $f_1$ and $f_2$ of the pulse generators inversely with respect to each other in response to the geometric value.

7. A generator as in claim 6, wherein the pulse generators are, other than in response to said input means, frequency independent of each other.

8. A pulse sequence generator according to claim 6 wherein the number of pulses of said second pulse generator can be controlled externally.

9. A pulse sequence generator according to claim 6, wherein each of said pulse generators includes at least one frequency determining element, said input means including an actuation element rotatable or displaceable as a function of said geometrical value and coupled to the frequency determining elements so that by the rotation or displacement of the actuation element the ratio of the frequency of said first pulse generator to the frequency of said second pulse generator is varied.

10. A pulse sequence generator according to claim 9, wherein each said element comprises at least one coil, and said actuation element comprises a core which can be rotated or displaced as a function of said geometrical value, whereby the inductivity of the coils is varied as a function of said geometrical value.

11. A pulse sequence generator according to claim 10, wherein at least one of said coils has a winding density varying over its length.

12. A pulse sequence generator according to claim 10, wherein said core has a permeability varying over its length.

13. A pulse sequence generator according to claim 10, wherein said core consists at least partially of fieldrepelling material.

14. A pulse sequence generator according to claim 10, wherein said core consists at least partially of ferritic material.

15. A pulse sequence generator according to claim 10, wherein said coils are arranged next to one another on a circle.

16. A pulse sequence generator according to claim 10, wherein said core is connected to a pressure or under-pressure sensor in particular a siphon diaphragm, so that it is displaced or rotated as a function of the pressure or under-pressure which is ascertained by said pressure or under-pressure sensor.

17. A pulse sequence generator according to claim 10, wherein said core is in the form of the piston of a pressure or under-pressure sensor, so that it is displaced or rotated as a function of the pressure or under-pressure which is ascertained by said pressure or under-pressure sensor.

18. A pulse sequence generator according to claim 6, wherein said counter can be controlled externally, so that the said two pulse generators can be switched on for different periods.

19. A pulse sequence generator for the production of pulse sequences whose pulse count depends on a geometric value, in particular a distance or an angle comprising: a first pulse generator for the production of pulse sequences in which the time interval between the pulses depends on said geometric value; and a time signal generator which controls the duration of the pulse sequence delivered in each case by said first pulse generator, said time signal generator including a second pulse generator for the production of pulse sequences in which the time interval between the pulses depends on said geometric value; and a counter which during the occurrence of a predetermined number of pulses of said second pulse generator switches on said first pulse generator, the frequency ratio of the two pulse generators being variable by said geometric value, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each said switching element including at least one coil, and each said actuation element comprises a core which can be rotated or displaced as a function of said geometric value, whereby the inductivity of the coils is varied as a function of said geometric value, said coils having a common core which is arranged so that upon its rotation or displacement in a predetermined range, the variation of the inductivities of the coils takes place in opposite directions, the inductivity of one coil is increased and simultaneously the inductivity of the other coil is reduced.

20. A pulse sequence generator for the production of pulse sequences whose pulse count depends on a geometric value, in particular a distance or an angle comprising: a first pulse generator for the production of pulse sequences in which the time interval between the pulses depends on said geometric value and a time signal generator which controls the duration of the pulse sequence delivered in each case by said first pulse generator, said time signal generator including a second pulse generator for the production of pulse sequences in which the time interval between the pulses depends on said geometric value; and a counter which during the occurrence of a predetermined number of pulses of said second pulse generator switches on said first pulse generator, the frequency ratio of the two pulse generators being variable by said geometric value, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each said switching element including at least one coil, and each said actuation element comprises a core which can be rotated or displaced as a function of said geometric value, whereby the inductivity of the coils is varied as a function of said geometric value, said coils being arranged coaxially next to one another and are provided with a common core consisting substantially of field-repelling material.

21. A pulse sequence generator for the production of pulse sequences whose pulse count depends on a geometric value, in particular a distance or an angle comprising: a first pulse generator for the production of pulse sequences in which the time interval between the pulses depends on said geometric value; and a time signal generator which controls the duration of the pulse sequence delivered in each case by said first pulse generator, said time signal generator including a second pulse generator for the production of pulse sequences in which the time interval between the pulses depends on said geometric value; and a counter which during the occurrence of a predetermined number of pulses of said second pulse generator switches on said first pulse generator, the frequency ratio of the two pulse generators being variable by said geometric value, the frequency of each of said pulse generators being variable by at least one switching element, each switching element being provided with an actuation element rotatable or displaceable as the function of said geometric value and varying the frequency determining value of the switching element so that by the rotation or displacement of the actuation element the ratio of the frequency of said first pulse generator to the frequency of said second pulse generator is varied, each said switching element including at least on coil, and each said actuation element comprises a core which can be rotated or displaced as a function of said geometric value, whereby the inductivity of the coils is varied as a function of said geometric value, said coils being arranged coaxially next to one another and are provided with a common core which has two ferritic parts, which are each associated with one of said coils and have a screen between them to separate said coils.

22. A pulse sequence generator for the production of pulse sequences whose pulse count depends on a geometric value, in particular a distance or an angle comprising: a first pulse generator for the production of pulse sequences in which the time interval between the pulses depends on said geometric value; and a time signal generator which controls the duration of the pulse sequence delivered in each case by said first pulse generator, said time signal generator including a second pulse generator for the production of pulse sequences in which the time interval between the pulses depends on said geometric value; and a counter which during the occurrence of a predetermined number of pulses of said second pulse generator switches on said first pulse generator, the frequency ratio of the two pulse generators being variable by said geometric value, the frequency of each of said pulse generators being variable by at least one switching element, each switching element being provided with an actuation element rotatable or displaceable as a function of said geometric value and varying the frequency determining value of the switching element so that by the rotation or displacement of the actuation element the ratio of the frequency of said first pulse generator to the frequency of said second pulse generator is varied, each said switching element including at least one coil, and each said actuation element comprises a core which can be rotated or displaced as a function of said geometric value, whereby the inductivity of the coils is varied as a function of said geometric value, said coils being arranged next to one another on a circle, the coil of each said pulse generator including a plurality of part coils which are connected in series and of equal size but are wound in opposite direction to one another and are arranged radially opposite one another, the coil axes being perpendicular to the plane of the circle, a core being rotatable perpendicular to the bobbin axes through or over the coils.

23. A pulse sequence generator according to claim 22, wherein said coils are would on first cylinder sectors of a ferrite shell core over which half as many second cylinder sectors diametrically arranged on a parallel circle of equal size are arranged rotatably, one group of sectors being connected to another another in each case by a ferrite disc on their side opposite the other sectors and in the centers of the ferrite discs a core extending perpendicular to the plane of the circles being provided.

* * * * *